United States Patent
Otaguro et al.

(10) Patent No.: US 12,107,412 B2
(45) Date of Patent: Oct. 1, 2024

(54) MOTOR DRIVE DEVICE, MOTOR SYSTEM AND ELECTRONIC DEVICE

(71) Applicant: ROHM CO., LTD., Kyoto (JP)

(72) Inventors: Yoshito Otaguro, Kyoto (JP); Ryota Kobayashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 156 days.

(21) Appl. No.: 17/947,776

(22) Filed: Sep. 19, 2022

(65) Prior Publication Data
US 2023/0100448 A1 Mar. 30, 2023

(30) Foreign Application Priority Data
Sep. 24, 2021 (JP) .................. 2021-155628

(51) Int. Cl.
| | |
|---|---|
| H02H 7/08 | (2006.01) |
| H02P 6/28 | (2016.01) |
| H02P 7/03 | (2016.01) |
| H02P 8/22 | (2006.01) |
| H03K 17/06 | (2006.01) |
| H03K 17/687 | (2006.01) |

(52) U.S. Cl.
CPC .......... *H02H 7/0838* (2013.01); *H02P 6/28* (2016.02); *H02P 7/04* (2016.02); *H02P 8/22* (2013.01); *H03K 17/063* (2013.01); *H03K 17/687* (2013.01)

(58) Field of Classification Search
CPC ...... H02P 8/00; H02P 8/12; H02P 8/18; H02P 8/22; H02P 8/40; H02P 7/00; H02P 7/04; H02P 7/05; H02P 7/29; H02P 27/08; H02P 25/034; H02P 25/066; H02P 29/032; H02P 25/022; H02P 21/22; H02P 2205/01; H02P 31/00; H02P 8/06
See application file for complete search history.

(56) References Cited

U.S. PATENT DOCUMENTS

2014/0217949 A1* 8/2014 Pascale ............ H02P 23/0004
318/503

FOREIGN PATENT DOCUMENTS

JP 2016-208727 12/2016

\* cited by examiner

*Primary Examiner* — Antony M Paul
(74) *Attorney, Agent, or Firm* — Fish & Richardson P.C.

(57) ABSTRACT

The present disclosure provides a motor drive device. The motor drive device includes a current detection unit, a control unit and a determination unit. The current detection unit detects a current flowing through a motor coil. The control unit executes a slow attenuation mode that attenuates the current after an end of a power supply mode. The determination unit determines whether the current at a second time point while a predetermined time has elapsed from a first time point when the power supply mode is switched to a slow decay mode is below a limit value. When the determination unit determines that the current does not fall below the limit value, the control unit is configured to switch from the slow attenuation mode to a fast attenuation mode at the second time point.

19 Claims, 5 Drawing Sheets

MOTOR DRIVE DEVICE, MOTOR SYSTEM AND ELECTRONIC DEVICE

TECHNICAL FIELD

The present application relates to a motor drive device, a motor system and an electronic device.

BACKGROUND

FIG. 4 shows a diagram of a configuration example of an H-bridge circuit used in a motor drive device for driving a step motor.

The H-bridge circuit shown in FIG. 4 includes P-channel field-effect transistors (FETs) 1 and 3 serving as high-side transistors, and N-channel FETs 2 and 4 serving as low-side transistors.

A power supply voltage VCC is applied to the source and back gate of the P-channel FET 1 and the source and back gate of the P-channel FET 3.

The drain of the N-channel FET 2 is connected to the drain of the P-channel FET 1. The drain of the N-channel FET 4 is connected to the drain of the P-channel FET 3. A ground voltage is applied to the source and back gate of N-channel FET 2 and the source and back gate of N-channel FET 4. The ground voltage is a voltage lower than the power supply voltage VCC.

A parasitic diode D1 is formed in the P-channel FET 1. The anode of the parasitic diode D1 is connected to the drain of the P-channel FET 1, and the cathode of the parasitic diode D1 is connected to the source and back gate of the P-channel FET 1.

A parasitic diode D2 is formed in the N-channel FET 2. The anode of the parasitic diode D2 is connected to the source and back gate of the N-channel FET 1, and the cathode of the parasitic diode D2 is connected to the drain of the N-channel FET 1.

A parasitic diode D3 is formed in the P-channel FET 3. The anode of the parasitic diode D3 is connected to the drain of the P-channel FET 3, and the cathode of the parasitic diode D3 is connected to the source and back gate of the P-channel FET 3.

A parasitic diode D4 is formed in the N-channel FET 4. The anode of the parasitic diode D4 is connected to the source and back gate of the N-channel FET 4, and the cathode of the parasitic diode D4 is connected to the drain of the N-channel FET 4.

A connection node N1 is a connection node between the drain of the P-channel FET 1 and the drain of the N-channel FET 2. A connection node N2 is a connection node of the drain of the P-channel FET 3 and the drain of the N-channel FET 4.

A motor coil L1 is connected between the connection node N1 and the connection node N2. Moreover, although the motor coil L1 is represented as being one-phase, two or three motor coils L1 are prepared in case of being two-phase or three-phase. In the present application, a one-phase example is used for illustration purposes. In the present application, although only the one-phase example is illustrated, similar details apply to drive operation portions of other phases and such repetition are omitted herein.

The start, switching of a rotation direction and stop of the step motor are controlled by switching a current path flowing through the H-bridge circuit. That is to say, a current-feeding mode and a current decay mode are distinguished on the basis of the current path flowing through the motor coil L1. Known current decay modes include a slow decay mode, a fast decay mode, and a mixed decay mode as a combination of the two.

FIG. 5 shows a diagram of on/off states of individual FETs and current paths in a current-feeding mode in a forward rotation direction. In the current-feeding mode in the forward rotation direction, the P-channel FET 1 and the N-channel FET 4 are turned on, and the N-channel FET 2 and the P-channel FET 3 are turned off. In the current-feeding mode in the forward rotation direction, a current 11 flows in a path from the P-channel FET 1 through the motor coil L1 to the N-channel FET 4.

FIG. 6 shows a diagram of on/off states of individual FETs and current paths in a slow decay mode when the current-feeding mode in the forward rotation direction is switched to the slow decay mode. In the slow decay mode, the N-channel FETs 2 and 4 are turned on, and the P-channel FETs 1 and 3 are turned off. In the slow decay mode, a current 12 flows in a cyclic path from the N-channel FET 2, the motor coil 11 and the N-channel FET 4.

FIG. 7A and FIG. 7B are diagram of on/off states of individual FETs and current paths in a fast decay mode when the current-feeding mode in the forward rotation direction is switched to the fast decay mode. In the fast decay mode in FIG. 7A, the N-channel FET 2 and the P-channel FET 3 are turned on, and the P-channel FET 1 and the N-channel FET 4 are turned off. In the fast decay mode in FIG. 7A, a current 13 flows in a path from the N-channel FET 2 through the motor coil L1 to the P-channel FET 3. In the fast decay mode in FIG. 7B, the P-channel FETs 1 and 3 and the N-channel FETs 2 and 4 are turned off. In the fast decay mode in FIG. 7B, the current 13 flows in a path from a parasitic diode D2 through the motor coil L1 to a parasitic diode D3.

By having the on resistances of the P-channel FETs 1 and 3 be greater than the on resistances of the N-channel FETs 2 and 4, the amount of current decay in the fast decay mode is greater than the amount of current decay in the slow decay mode.

FIG. 8 shows an illustration diagram of a waveform of a current flowing through the motor coil L1 when a current-feeding mode M1 and a slow decay mode M2 are performed repeatedly.

A minimum on-time $t_1$, which is a fixed time, is necessarily the current-feeding mode M1. Once the minimum on-time $t_1$ ends, if the current flowing through the motor coil L1 is above a limit value LM, the current-feeding mode M1 is immediately switched to the slow decay mode M2. If the current flowing through the motor coil L1 when the minimum on-time $t_1$ ends has not yet reached the limit value LM, the current-feeding mode M1 continues until the current flowing through the motor coil L1 reaches above the limit value LM, and the current-feeding mode M1 is switched to the slow decay mode M2 at the time point at which the current flowing through the motor coil L1 reaches the limit value LM. The time at which the slow decay mode M2 is performed in each cycle is fixed. An off-time $t_2$ in FIG. 8 is the time at which the slow decay mode M2 is performed in each cycle. By setting the minimum on-time $t_1$, at least a fixed time in each cycle is ensured for the current-feeding mode M1.

In the slow decay mode M2, the current flowing through the motor coil L1 decreases in a stable manner. Thus, ripples of the current are reduced, and this is beneficial from the perspective of motor torque. However, current controllability in a small region becomes poor and an output current increases, or when high pulse rate driving is performed in a half-step mode or quarter-step mode, influences from a reverse voltage of the motor can be easily received. Thus, drawbacks including distortion of the current flowing through the motor coil L1 due to the inability of following the change in the reverse voltage, and increased vibration of the motor are resulted.

FIG. 9 shows an illustration diagram of a waveform of a current flowing through the motor coil L1 when a current-feeding mode M1 and a fast decay mode M3 are performed repeatedly.

A minimum on-time $t_1$, which is a fixed time, is necessarily the current-feeding mode M1. Once the minimum on-time $t_1$ ends, if the current flowing through the motor coil L1 is above the limit value LM, the current-feeding mode M1 is immediately switched to the fast decay mode M3. If the current flowing through the motor coil L1 when the minimum on-time $t_1$ ends has not yet reached the limit value LM, the current-feeding mode M1 continues until the current flowing through the motor coil L1 reaches above the limit value LM, and the current-feeding mode M1 is switched to the fast decay mode M3 at the time point at which the current flowing through the motor coil L1 reaches the limit value LM. The time at which the fast decay mode M3 is performed in each cycle is fixed. An off-time $t_2$ in FIG. 9 is the time at which the fast decay mode M3 is performed in each cycle.

In the fast decay mode M3, the current flowing through the motor coil L1 decreases drastically. Thus, the distortion of the current flowing through the motor coil L1 can be alleviated during high pulse rate driving. That is to say, compared to the slow decay mode M2, the ability to follow the reverse voltage is improved in the fast decay mode M3. However, because the ripples of the current flowing through the motor coil L1 are increased, the average current is decreased and the motor torque is also reduced. Moreover, power loss of the motor as well as generated heat are increased.

PRIOR ART DOCUMENT

Patent Publication

[Patent document 1] Japan Patent Publication No. 2016-208727

SUMMARY

Problems to be Solved by the Disclosure

A mixed decay mode is a current decay mode capable of eliminating drawbacks of the slow decay mode and the fast decay mode, and is a current decay mode that switches between the slow decay mode and the fast decay mode during a current decay time (for example, referring to patent document 1).

However, in a conventional mixed decay mode, due to the fast decay mode that needs to be performed in each cycle, there remains a concern of enlarged ripples of the current flowing through the motor coil L1.

Technical Means for Solving the Problem

A motor drive device disclosed by the present application includes: a current detector, configured to detect a current flowing through a motor coil; a control unit, configured to perform a slow decay mode for decaying the current after a current-feeding mode ends in each cycle; and a determination unit, configured to determine whether the current, at a second time point after a predetermined time has elapsed from a first time point when the current-feeding mode is switched to the slow decay mode, is below a limit value. When the determination unit determines that the current is not below the limit value, the control unit is configured to, at the second time point, switch the slow decay mode to a fast decay mode that attenuates the current more rapidly than the slow decay mode. Each of the cycles only includes one continuous current-feeding mode and one continuous current decay mode. Each of the current decay modes only includes the slow decay mode or both the slow decay mode and the fast decay mode.

The motor system disclosed by the present application includes a motor, and the motor drive device configured to drive the motor of the above configuration.

An electronic device disclosed by the application includes the motor system of the above configuration.

Effects of the Disclosure

In the motor drive device, the motor system and the electronic device disclosed by the present application, the issue of distortion of the current flowing through the motor coil due to the inability of following the change in the reverse voltage can be inhibited, and the ripples of the current flowing through the motor coil can be mitigated as much as possible.

DETAILED DESCRIPTION

Figure 1:
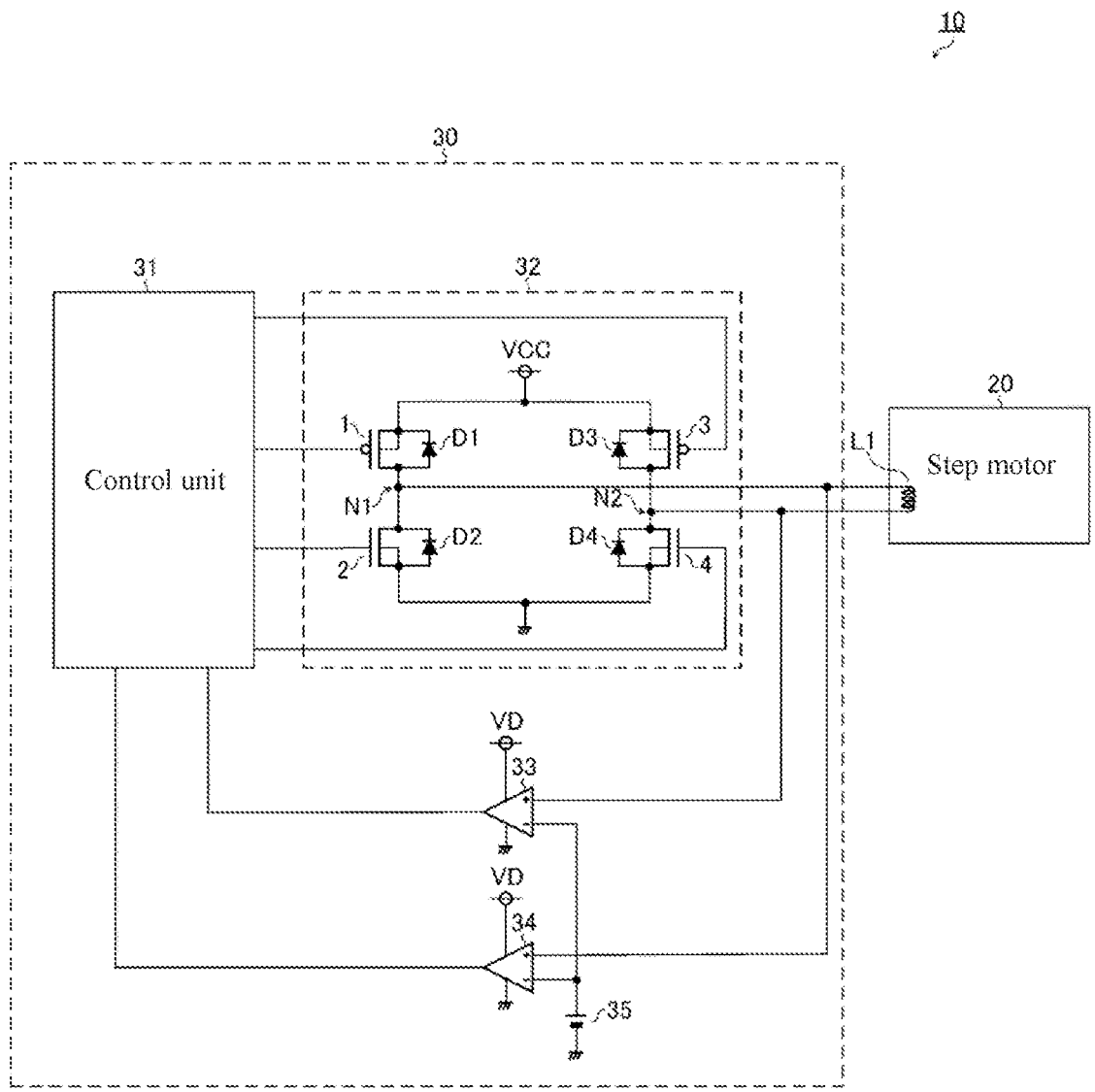
FIG. 1 is a diagram of a brief configuration of a motor system according to an embodiment.

FIG. 1 shows a diagram of a brief configuration of a motor system according to an embodiment. The motor system 10 according to an embodiment includes a step motor 20, and a motor drive device 30 configured to drive the step motor 20.

The motor drive device 30 includes a control unit 31, an H-bridge circuit 32, a comparator 33, a comparator 34 and a reference voltage source 35. The H-bridge circuit 32, the comparator 33 and the comparator 34 correspond to one phase of the step motor 20. When the step motor 20 is two-phase or three-phase, the H-bridge circuit 32, the comparator 33 and the comparator 34 are provided as being two or three in quantity. In the present application, a one-phase example is used for illustration purposes. In the present application, although only the one-phase example is illustrated, similar details apply to drive operation portions of other phases and such repetition are omitted herein. Moreover, one comparator may also be used in substitution to for the two comparators 33 and 34. When one comparator is used, a timing for reading the voltage of a connection node N1 and a timing for reading the voltage of a connection node N2 are controlled by, for example, a switching switch, wherein the switching switch selects one between the voltage of the connection node N1 and the voltage of the connection node N2 and supplies the selected voltage to the one comparator.

Figure 4:
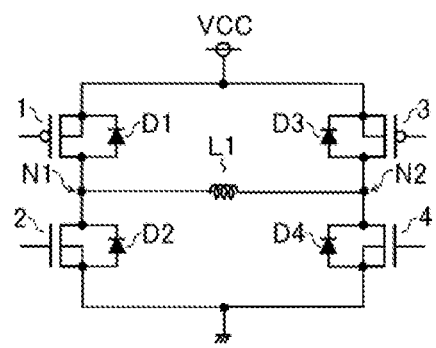
FIG. 4 is a diagram of a configuration example of an H-bridge circuit.
Figure 5:
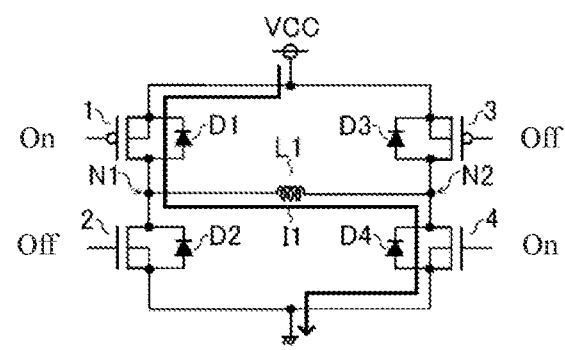
FIG. 5 is a diagram of on/off states of individual FETs and current paths in a current-feeding mode in a forward rotation direction.
Figure 6:
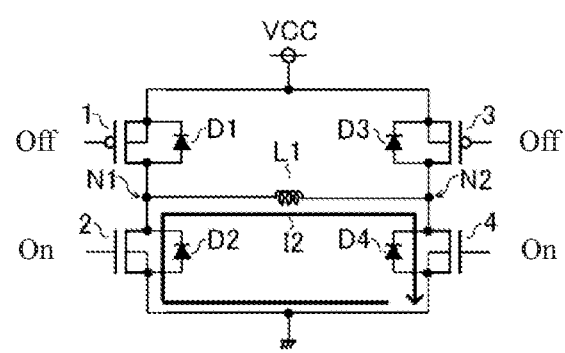
FIG. 6 is a diagram of on/off states of individual FETs and current paths in a slow decay mode.
Figure 7A:
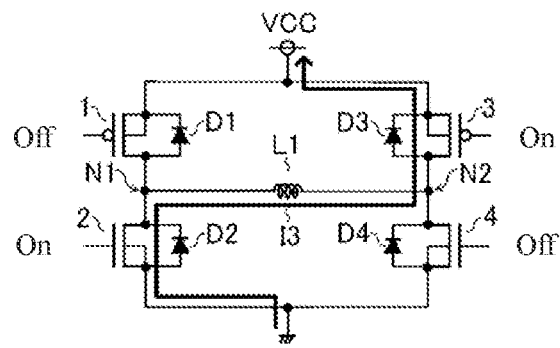
FIG. 7A is a diagram of on/off states of individual FETs and current paths in a fast decay mode.
Figure 7B:
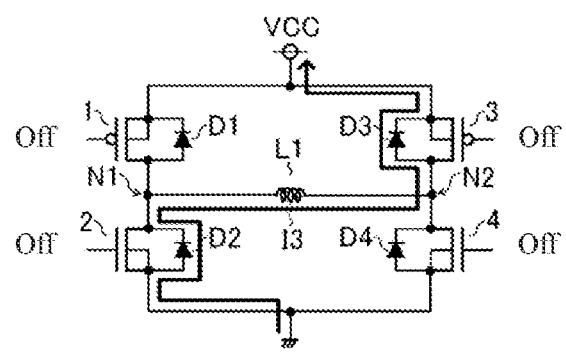
FIG. 7B is a diagram of on/off states of individual FETs and current paths in a fast decay mode.
Figure 8:
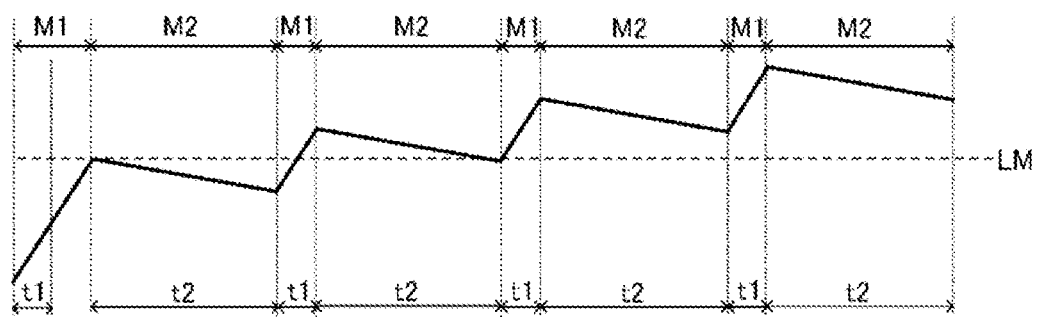
FIG. 8 is an illustration diagram of a waveform of a current flowing through a motor coil when a current-feeding mode and a slow decay mode are performed repeatedly.
Figure 9:
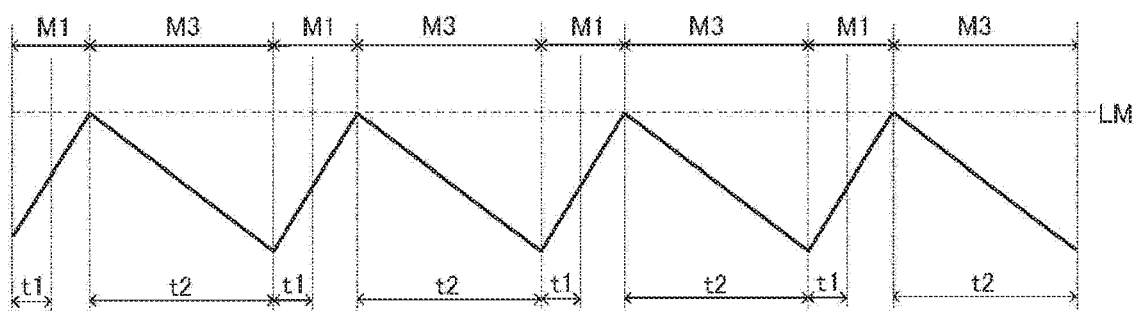
FIG. 9 is an illustration diagram of a waveform of a current flowing through a motor coil when a current-feeding mode and a fast decay mode are performed repeatedly.

The H-bridge circuit 32 is identically structured as the H-bridge circuit in FIG. 4. Moreover, for example, N-channel FETs may be used in substitution for the P-channel FETs 1 and 3.

When a current-feeding mode in a forward rotation direction and a current decay mode are performed repeatedly, the N-channel FET 4 functions as a current detector that indirectly detects the current flowing through the motor coil L1. The N-channel FET 4 uses the on resistance of the N-channel FET 4 to detect the drain-source voltage (drain voltage) of the N-channel FET 4 when the N-channel FET 4 is turned on, accordingly detecting the current flowing through the motor coil L1. As such, power loss can be reduced because no additional current detection resistor is required.

When a current-feeding mode in a reverse rotation direction and a current decay mode are performed repeatedly, the N-channel FET 2 functions as a current detector that indirectly detects the current flowing through the motor coil L1. The N-channel FET 2 uses the on resistance of the N-channel FET 2 to detect the drain-source voltage (drain voltage) of the N-channel FET 2 when the N-channel FET 2 is turned on, accordingly detecting the current flowing through the motor coil L1. As such, power loss can be reduced because no additional current detection resistor is required.

The control unit 31 performs a current-feeding mode, a slow decay mode and a fast decay mode in each cycle by switching and controlling the individual FETs of the H-bridge circuit 32.

When the current-feeding mode in the forward rotation direction and the current decay mode are performed repeatedly, the comparator 33 determines whether the current, flowing through the motor coil L1 at a second time point after a predetermined time has elapsed from a first time point when the current-feeding mode is switched to the slow decay mode, is below a limit value LM.

The comparator 33 compares the drain voltage of the N-channel FET 4 and a reference voltage output from the reference voltage source 35. The reference voltage output from the reference voltage source 35 is set to be a value corresponding to the limit value. The output of the comparator 33 at the second time point becomes a determined result of the determination unit when the current-feeding mode in the forward rotation direction and the current decay mode are performed repeatedly.

When the current-feeding mode in the reverse rotation direction and the current decay mode are performed repeatedly, the comparator 34 determines whether the current, flowing through the motor coil L1 at the second time point after the predetermined time has elapsed from the first time point when the current-feeding mode is switched to the slow decay mode, is below the limit value LM.

The comparator 34 compares the drain voltage of the N-channel FET 2 and the reference voltage output from the reference voltage source 35. The output of the comparator 34 at the second time point becomes a determined result of the determination unit when the current-feeding mode in the reverse rotation direction and the current decay mode are performed repeatedly.

Figure 2:
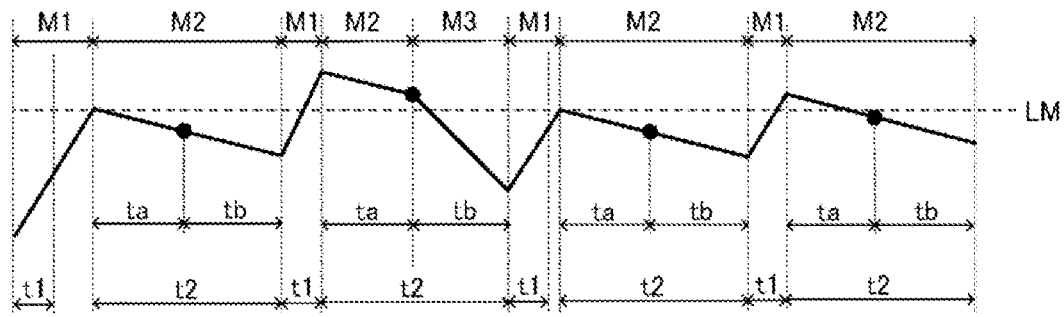
FIG. 2 is an illustration diagram of a waveform of a current flowing through a motor coil when a current-feeding mode and a current decay mode are performed repeatedly.

FIG. 2 shows an illustration diagram of a waveform of the current flowing through the motor coil L1 when the current-feeding mode M1 and the current decay mode are performed repeatedly in the motor drive device 30. Each of the cycles only includes one continuous current-feeding mode M1 and one continuous current decay mode. The current decay mode only includes the slow decay mode M2 or both the slow decay mode M2 and the fast decay mode M3.

A minimum on-time $t_1$, which is a fixed time, is necessarily the current-feeding mode M1. Once the minimum on-time $t_1$ ends, if the current flowing through the motor coil L1 is above a limit value LM, the current-feeding mode M1 is immediately switched to the slow decay mode M2. If the current flowing through the motor coil L1 when the minimum on-time $t_1$ ends has not yet reached the limit value LM, the current-feeding mode M1 continues until the current flowing through the motor coil L1 reaches above the limit value LM, and the current-feeding mode M1 is switched to the slow decay mode M2 at the time point at which the current flowing through the motor coil L1 reaches the limit value LM. The time at which the current decay mode is performed in each cycle is fixed. An off-time $t_2$ in FIG. 2 is the time at which the current decay mode is performed in each cycle. By setting the minimum on-time $t_1$, at least a fixed time in each cycle is ensured for the current-feeding mode M1.

When it is determined that the current flowing through the motor coil L1 at the second time point (the time point indicated by a solid dot in FIG. 2) after the predetermined time has elapsed from the first time point when the current-feeding mode M1 is switched to the slow decay mode M2 is not below the limit value LM, the slow decay mode M2 is switched to the fast decay mode M3 at the second time point.

When it is determined that the current flowing through the motor coil L1 at the second time point (the time point indicated by a solid dot in FIG. 2) after the predetermined time has elapsed from the first time point when the current-feeding mode M1 is switched to the slow decay mode M2 is below the limit value LM, the slow decay mode M2 continues until a time point of the end of the current cycle.

As such, the issue of distortion of the current flowing through the motor coil L1 due to the inability of following the change in the reverse voltage can be inhibited, and the ripples of the current flowing through the motor coil L1 can be mitigated as much as possible.

Moreover, in this embodiment, the length of the predetermined time is a value obtained by multiplying a time from the first time point to an end of the current cycle by a predetermined ratio (greater than 0 and smaller than 1). That is, a ratio of a time $t_a$ in FIG. 2 to a total time (time $t_2$) of the time $t_a$ and a time $t_b$ in each cycle is used as the predetermined ratio. As such, it is necessarily determined in each cycle whether the current flowing through the motor coil L1 at the second time point after the predetermined time has elapsed from the first time point when the current-feeding mode is switched to the slow decay mode is below the limit value LM.

Moreover, although the predetermined ratio may be fixed, the set value thereof ideally is variable according to an external signal. In addition, different from this embodiment, the length of the time $t_a$ in FIG. 2 may be set to a predetermined value, or the length of the time $t_b$ in FIG. 2 may be set to a predetermined value.

Figure 3:
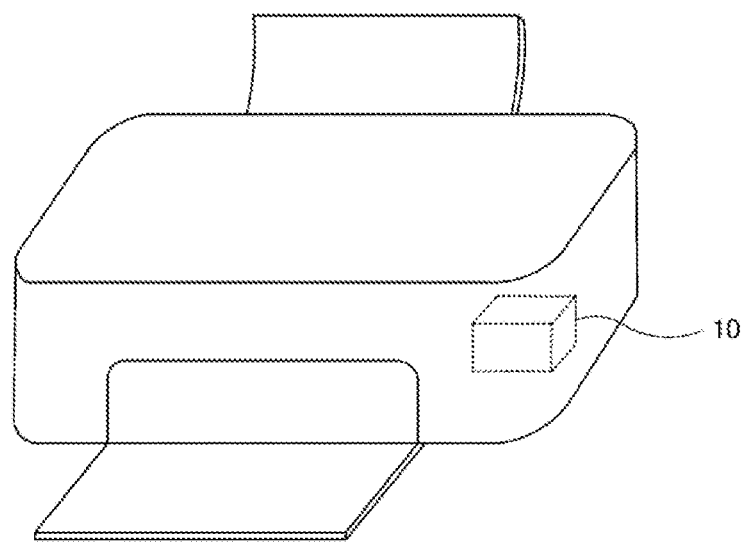
FIG. 3 is a perspective diagram of an appearance of a printer.

The motor system 10 of the embodiment is, for example, built in a printer 40 shown in FIG. 3, as a part of a paper conveying mechanism. Moreover, the motor system 10 of the embodiment may also be equipped in an electronic device other than a printer.

In addition to the embodiments, various modifications may be applied to the configurations of the present disclosure without departing from the scope of the inventive subject thereof. It should be understood that all aspects of the embodiment are exemplary rather than restrictive, and it should also be understood that the technical scope of the present disclosure is represented by way of the claims but not the non-limiting embodiments, including all variations made within equivalent meanings and scopes accorded with the claims.

For example, an amplifier may be used in substitution for the comparator, and it is determined in advance, based on an output of the amplifier at the first time point when the current-feeding mode is switched to the current decay mode, whether the current flowing through the motor coil L1 at the second time point after the predetermined time has elapsed from the first time point is below the limit value LM.

The motor drive device (30) of the description above is configured as below (first configuration), that is, including: a current detector (2, 4), configured to detect a current flowing through a motor coil (L1); a control unit (31), configured to perform a slow decay mode for decaying the current after a current-feeding mode ends in each cycle; and a determination unit (33, 34, 35), configured to determine whether the current at a second time point after a predetermined time has elapsed from a first time point when the current-feeding mode is switched to the slow decay mode is below a limit value; wherein, when the determination unit determines that the current is not below the limit value, the control unit is configured to, at the second time point, switch the slow decay mode to a fast decay mode that attenuates the current more rapidly than the slow decay mode, each of the cycles only includes one continuous current-feeding mode and one continuous current decay mode, and each of the current decay modes only includes the slow decay mode or both the slow decay mode and the fast decay mode.

In the motor drive device of the first configuration, the issue of distortion of the current flowing through the motor coil due to the inability of following the change in the reverse voltage can be inhibited, and the ripples of the current flowing through the motor coil can be mitigated as much as possible.

The motor drive device of the first configuration may also be configured as below (second configuration), that is, wherein when the determination unit determines that the current is below the limit value, the control unit is configured to continue the slow decay mode even after the second time point.

The motor drive device of the second configuration is capable of more reliably mitigating the ripples of the current flowing through the motor coil.

The motor drive device of the first or second configuration may also be configured as below (third configuration), that is, wherein in each cycle, the control unit is configured to perform the current-feeding mode at least until a minimum on-time elapses, and if the current has not reached the limit value at an end of the minimum on-time, the current-feeding mode continues until the limit value is reached.

In the motor drive device of the third configuration, since the minimum on-time is set, at least a fixed time in each cycle is ensured for the current-feeding mode.

The motor drive device of any of the first to third configurations may also be configured as below (fourth configuration), that is, including an H-bridge circuit (32), wherein the current detector is configured to detect the current by detecting a voltage between a first terminal and a second terminal of a low-side transistor (2, 4) of the H-bridge circuit.

In the motor drive device of the fourth configuration, power loss can be reduced because no additional current detection resistor is required.

The motor drive device of any of the first to fourth configurations may also be configured as below (fifth configuration), that is, wherein the determination unit includes a comparator (33, 34) configured to compare a first voltage corresponding to the current and a second voltage corresponding to the limit value, and an output of the comparator at the second time point becomes a determined result of the determination unit.

In the motor drive device of the fifth configuration, the circuit structure can be simplified because no additional amplifier serving as a determination unit is required.

The motor drive device of any of the first to fifth configurations may also be configured as below (sixth configuration), that is, wherein a length of the predetermined time is a value obtained by multiplying a time from the first time point to an end of the current cycle by a predetermined ratio between 0 and 1.

In the motor drive device of the sixth configuration, it is not necessary to determine a relationship between values of the length of the predetermined time and the time from the first time point to the end of the current cycle to set the length of the predetermined time.

The motor system (10) of the description above is configured as below (seventh configuration), that is, including a motor (20), and the motor drive device of any one of the first to sixth configurations configured to drive the motor.

In the motor system of the seventh configuration, the issue of distortion of the current flowing through the motor coil due to the inability of following the change in the reverse voltage can be inhibited, and the ripples of the current flowing through the motor coil can be mitigated as much as possible.

The electronic device (40) of the description above is configured as below (eighth configuration), that is, including the motor system of the seventh configuration.

In the electronic device of the eighth configuration, the issue of distortion of the current flowing through the motor coil due to the inability of following the change in the reverse voltage can be inhibited, and the ripples of the current flowing through the motor coil can be mitigated as much as possible.

The invention claimed is:

1. A motor drive device, comprising:
   a current detector, configured to detect a current flowing through a motor coil;
   a control unit, configured to perform a slow decay mode for attenuating the current after a current-feeding mode ends in each cycle; and
   a determination unit, configured to determine whether the current at a second time point after a predetermined time has elapsed from a first time point when the current-feeding mode is switched to the slow decay mode and is below a limit value, wherein a length of the predetermined time is a value obtained by multiplying a time from the first time point to an end of the current cycle by a predetermined ratio between 0 and 1, wherein when the determination unit determines that the current is not below the limit value, the control unit is configured to, at the second time point, switch the slow decay mode to a fast decay mode that attenuates the current more rapidly than the slow decay mode, each of the cycles only includes one continuous current-feeding mode and one continuous current decay mode, and each of the current decay modes only includes the slow decay mode or both the slow decay mode and the fast decay mode.

2. The motor drive device of claim 1, wherein when the determination unit determines that the current is below the limit value, the control unit is configured to continue the slow decay mode even after the second time point.

3. The motor drive device of claim 2, wherein
the control unit is configured to, in each cycle, perform the current-feeding mode at least until a minimum on-time elapses, and
if the current has not reached the limit value at an end of the minimum on-time, the current-feeding mode continues until the limit value is reached.

4. The motor drive device of claim 2, further comprising an H-bridge circuit, wherein the current detector is configured to detect the current by detecting a voltage between a first terminal and a second terminal of a low-side transistor of the H-bridge circuit.

5. The motor drive device of claim 2, wherein
the determination unit includes a comparator configured to compare a first voltage corresponding to the current and a second voltage corresponding to the limit value, and
an output of the comparator at the second time point becomes a determined result of the determination unit.

6. The motor drive device of claim 2, wherein a length of the predetermined time is a value obtained by multiplying a time from the first time point to an end of the current cycle by a predetermined ratio between 0 and 1.

7. A motor system, comprising:
a motor; and
the motor drive device of claim 2, configured to drive the motor.

8. The motor drive device of claim 1, wherein
the control unit is configured to, in each cycle, perform the current-feeding mode at least until a minimum on-time elapses, and
if the current has not reached the limit value at an end of the minimum on-time, the current-feeding mode continues until the limit value is reached.

9. The motor drive device of claim 8, further comprising an H-bridge circuit, wherein the current detector is configured to detect the current by detecting a voltage between a first terminal and a second terminal of a low-side transistor of the H-bridge circuit.

10. The motor drive device of claim 8, wherein
the determination unit includes a comparator configured to compare a first voltage corresponding to the current and a second voltage corresponding to the limit value, and
an output of the comparator at the second time point becomes a determined result of the determination unit.

11. The motor drive device of claim 8, wherein a length of the predetermined time is a value obtained by multiplying a time from the first time point to an end of the current cycle by a predetermined ratio between 0 and 1.

12. A motor system, comprising:
a motor; and
the motor drive device of claim 8, configured to drive the motor.

13. The motor drive device of claim 1, further comprising an H-bridge circuit, wherein the current detector is configured to detect the current by detecting a voltage between a first terminal and a second terminal of a low-side transistor of the H-bridge circuit.

14. The motor drive device of claim 13, wherein
the determination unit includes a comparator configured to compare a first voltage corresponding to the current and a second voltage corresponding to the limit value, and
an output of the comparator at the second time point becomes a determined result of the determination unit.

15. The motor drive device of claim 13, wherein a length of the predetermined time is a value obtained by multiplying a time from the first time point to an end of the current cycle by a predetermined ratio between 0 and 1.

16. The motor drive device of claim 1, wherein
the determination unit includes a comparator configured to compare a first voltage corresponding to the current and a second voltage corresponding to the limit value, and
an output of the comparator at the second time point becomes a determined result of the determination unit.

17. The motor drive device of claim 16, wherein a length of the predetermined time is a value obtained by multiplying a time from the first time point to an end of the current cycle by a predetermined ratio between 0 and 1.

18. A motor system, comprising:
a motor; and
the motor drive device of claim 1, configured to drive the motor.

19. An electronic device, comprising the motor system of claim 18.

* * * * *